United States Patent
You (10) Patent No.: US 10,734,435 B2
(45) Date of Patent: Aug. 4, 2020

(54) IMAGE CAPTURING MODULE AND MANUFACTURING METHOD THEREOF

(71) Applicant: Gingy Technology Inc., Hsinchu (TW)

(72) Inventor: Kuo-Liang You, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 0 days.

(21) Appl. No.: 15/888,105

(22) Filed: Feb. 5, 2018

(65) Prior Publication Data

US 2018/0301500 A1  Oct. 18, 2018

Related U.S. Application Data

(60) Provisional application No. 62/486,954, filed on Apr. 18, 2017.

(30) Foreign Application Priority Data

Nov. 2, 2017 (CN) .......................... 2017 1 1062746

(51) Int. Cl.
*H01L 27/00* (2006.01)
*H01L 27/146* (2006.01)
(Continued)

(52) U.S. Cl.
CPC ...... *H01L 27/14678* (2013.01); *G06K 9/0004* (2013.01); *G06K 9/209* (2013.01); *H01L 27/14636* (2013.01); *H01L 27/14683* (2013.01); *H01L 27/14862* (2013.01); *G06K 9/00013* (2013.01)

(58) Field of Classification Search
CPC combination set(s) only.
See application file for complete search history.

(56) References Cited

U.S. PATENT DOCUMENTS 9,510,459 B2  11/2016  Yan et al.
9,611,143 B2  4/2017  Ho et al.
(Continued)

FOREIGN PATENT DOCUMENTS

CN  101202253  6/2008
CN  104979426  10/2015
(Continued)

OTHER PUBLICATIONS

"Office Action of Taiwan Counterpart Application," dated Dec. 27, 2018, p. 1-p. 7.

*Primary Examiner* — Mohammad M Choudhry
(74) *Attorney, Agent, or Firm* — JCIPRNET (57) ABSTRACT

An image capturing module including a light emitting element, a sensing element, a first circuit substrate, a second circuit substrate, and a third circuit substrate is provided. The first circuit substrate is located between the second circuit substrate and the third circuit substrate and includes a first substrate having a first and a second through holes. The light emitting element is mounted on the third circuit substrate and disposed in the first through hole. The sensing element is disposed in the second through hole. The second circuit substrate includes a second substrate having a third and a fourth through holes. The third through hole exposes a light emitting surface of the light emitting element disposed in the first through hole. The fourth through hole exposes a sensing surface of the sensing element disposed in the second through hole. A manufacturing method of the image capturing module is also provided.

11 Claims, 11 Drawing Sheets

FIG. 1A (51) Int. Cl.
*H01L 27/148* (2006.01)
*G06K 9/20* (2006.01)
*G06K 9/00* (2006.01)

(56) References Cited

U.S. PATENT DOCUMENTS

| | | |
|---|---|---|
| 2008/0023722 A1 | 1/2008 | Lee et al. |
| 2016/0041029 A1 | 2/2016 | T'Ng et al. |
| 2017/0061193 A1 | 3/2017 | Young et al. |
| 2017/0083740 A1 | 3/2017 | Chang et al. |

FOREIGN PATENT DOCUMENTS

| | | |
|---|---|---|
| JP | 2006189949 | 7/2006 |
| JP | 2007179434 | 7/2007 |
| TW | 200611429 | 4/2006 |
| TW | M301406 | 11/2006 |
| TW | I505414 | 10/2015 |
| TW | I556177 | 11/2016 |
| TW | I562011 | 12/2016 |

IMAGE CAPTURING MODULE AND MANUFACTURING METHOD THEREOF

CROSS-REFERENCE TO RELATED APPLICATION

This application claims the priority benefit of U.S. provisional application Ser. No. 62/486,954, filed on Apr. 18, 2017 and China application Ser. No. 201711062746.5, filed on Nov. 2, 2017. The entirety of each of the above-mentioned patent application is hereby incorporated by reference herein and made a part of this specification.

BACKGROUND OF THE INVENTION

Field of the Invention

The invention relates to an optical module and manufacturing method thereof, and particularly relates to an image capturing module and manufacturing method thereof.

Description of Related Art

The types of biometric recognition include facial, voice, iris, retina, vein, palmprint and fingerprint recognition and so on. Based on different sensing methods, biometric identification devices may be divided into optical type, capacitive type, ultrasonic type and thermal induction type. The current optical type biometric identification devices have become one of the mainstream biometric identification technology. Therefore, how to enhance the market competitiveness of the optical type biometric identification device of the owned company has become one of the focuses of research and development of practitioners in the art.

SUMMARY OF THE INVENTION

The invention provides an image capturing module, which has a thin thickness and good recognition ability.

The invention provides a manufacturing method for an image capturing module, which may manufacture an image capturing module with thin thickness and good recognition ability.

An image capturing module of the invention includes a light emitting element, a sensing element, a first circuit substrate, a second circuit substrate, and a third circuit substrate. The first circuit substrate includes a first substrate. The first substrate has a first through hole and a second through hole. The light emitting element is disposed in the first through hole. The sensing element is disposed in the second through hole. The second circuit substrate is disposed on one side of the first circuit substrate and includes a second substrate. The second substrate has a third through hole and a fourth through hole. The third through hole overlaps the first through hole and exposes a light emitting surface of the light emitting element disposed in the first through hole. The fourth through hole overlaps the second through hole and exposes a sensing surface of the sensing element disposed in the second through hole. The third circuit substrate is disposed on another side of the first circuit substrate, and the first circuit substrate is located between the second circuit substrate and the third circuit substrate. The light emitting element is mounted on the third circuit substrate and electrically connected to the third circuit substrate.

The manufacturing method of an image capturing module of the invention includes steps as follow. Forming a first through hole and a second through hole in a first substrate. Forming a third through hole and a fourth through hole in a second substrate. Disposing a sensing element in the second through hole. Disposing a light emitting element on a third substrate. Bonding the first substrate, the second substrate and the third substrate, wherein the light emitting element is disposed in the first through hole, the third through hole overlaps the first through hole and exposes a light emitting surface of the light emitting element disposed in the first through hole, the fourth through hole overlaps the second through hole and exposes a sensing surface of the sensing element disposed in the second through hole.

Based on the above, in the image capturing module of an embodiment of the present invention, the light emitting element and the sensing element are disposed in through holes of the first substrate, thus contributing to reducing the overall thickness of the imaging capturing module. In addition, forming through holes in the first substrate and disposing the light emitting element and the sensing element in the through holes of the first substrate may allow a partition wall to be formed naturally between the light emitting element and the sensing element, which may effectively prevent light interferences caused by large angle beams of the light emitting element from irradiating directly onto the sensing element, thereby, enhancing the recognition ability of the image capturing module. Accordingly, the thickness of the image capturing module is thin and the image capturing module has good recognition ability. In addition, a manufacturing method of the above image capturing module is also provided.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 9 are schematic views of the manufacturing process of the image capturing module according to the first exemplary embodiment of the invention.

DETAILED DESCRIPTION OF DISCLOSED EMBODIMENTS

Figure 1A:
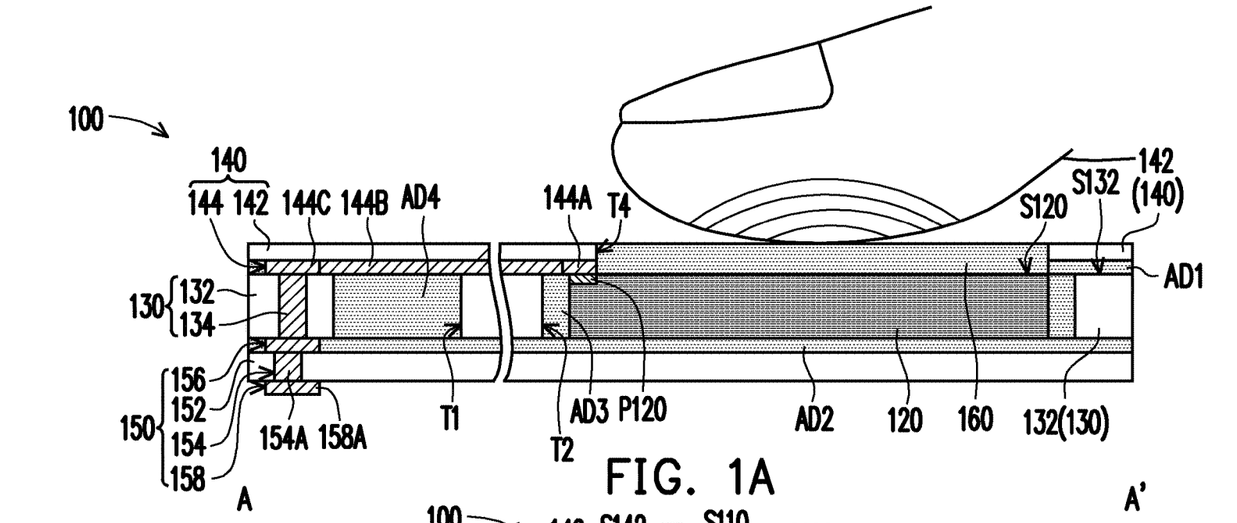
FIG. 1A and FIG. 1B are respectively cross-sectional schematic views of different parts of an image capturing module according to a first exemplary embodiment of the invention.
Figure 1B:
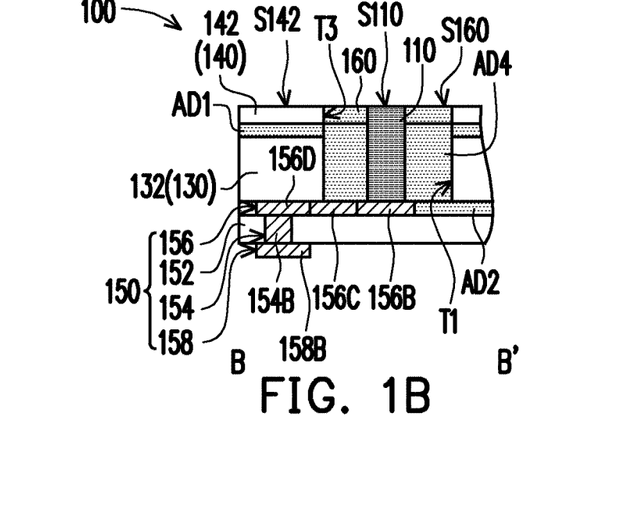
Figure 1C:
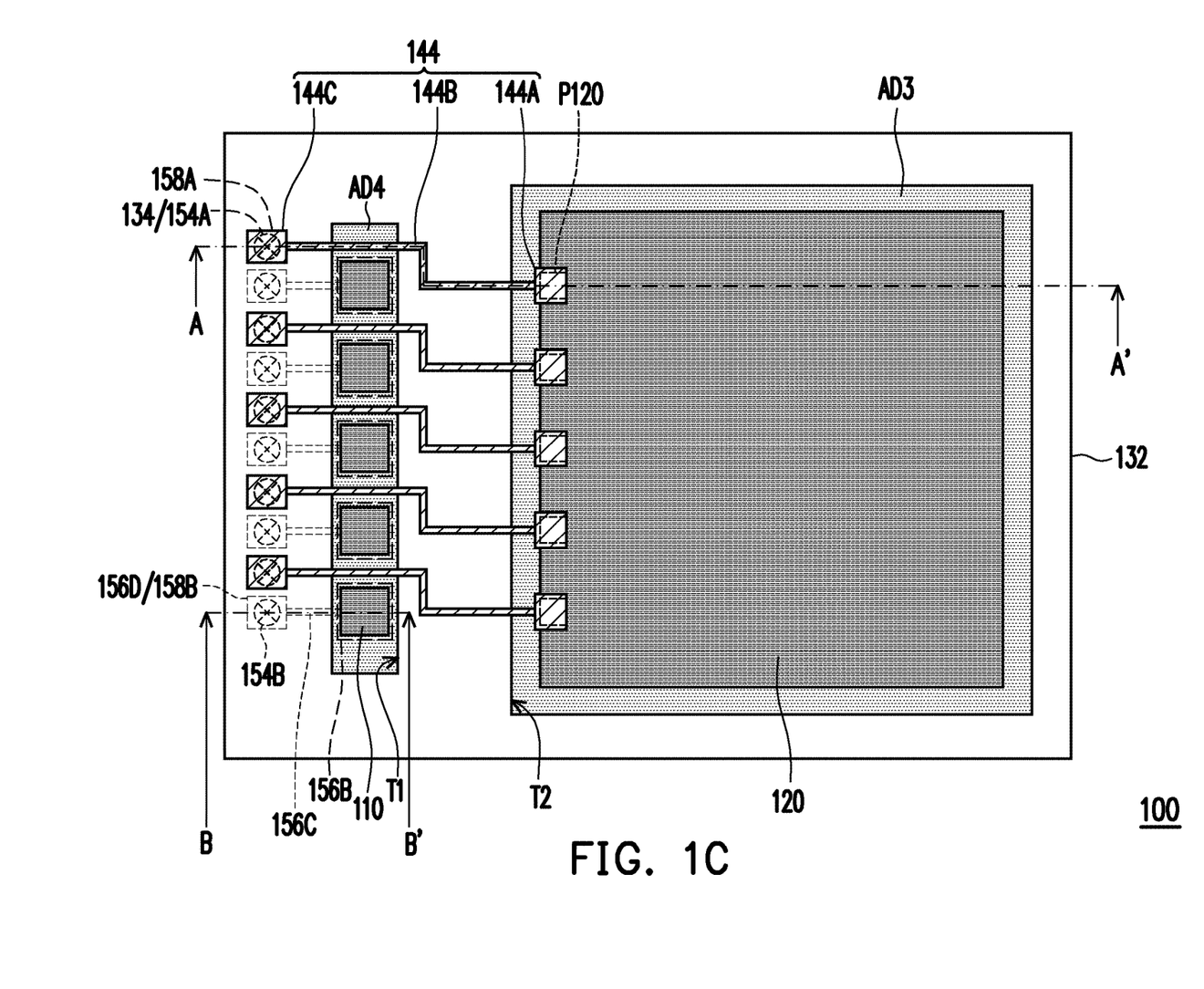
FIG. 1C is a schematic top view of the image capturing module according to the first exemplary embodiment of the invention.

FIG. 1A and FIG. 1B are respectively cross-sectional schematic views of different parts of an image capturing module according to the first exemplary embodiment of the invention. FIG. 1C is a schematic top view of the image capturing module according to the first exemplary embodiment of the invention. Please refer to FIG. 1A for a cross-sectional schematic view of a cutting line A-A' in FIG. 1C, and refer to FIG. 1B for a schematic cross-sectional view of a cutting line B-B' in FIG. 1C. The second substrate, the first adhesive layer and the translucent protective layer in FIG. 1A are not shown in FIG. 1C, to clearly show the relative configuration relationship of the elements located under these film layers.

Referring to FIG. 1A to FIG. 1C, an image capturing module 100 according to a first exemplary embodiment is suitable for capturing the biometric feature of a to-be-measured object 10. In the exemplary embodiment, the to-be-measured object 10 is, for example, a finger, and the biometric feature is, for example, a fingerprint or a vein, but is not limited herein. In another exemplary embodiment, the to-be-measured object 10 may also be a palm, and the biometric feature may be a palm print.

The image capturing module 100 includes a light emitting element 110, a sensing element 120, a first circuit substrate 130, a second circuit substrate 140, and a third circuit substrate 150.

The light emitting element 110 provides a light beam (not shown) that irradiates the to-be-measured object 10. Based on different needs, the image capturing module 100 may include one or a plurality of light emitting elements 110. In the exemplary embodiment, the image capturing module 100 includes a plurality of light emitting elements 110 (FIG. 1C shows five light emitting elements 110), and the plurality of light emitting elements 110 are arranged on the same side of the sensing element 120. However, the number of the light emitting elements 110 and the relative configuration relationship between the light emitting elements 110 and the sensing element 120 may change according to the requirements, and are not limited to that shown in FIG. 1C.

The plurality of light emitting elements 110 may include a light emitting diode, a laser diode or a combination of the two above. In addition, the light beam may include a visible light, a non-visible light or a combination of the two above. The non-visible light may be an infrared light, but is not limited herein.

The sensing element 120 receives a portion of the light beam reflected by the to-be-measured object 10 (which is, a reflected light beam with fingerprint pattern information), to identify the biometric feature of the to-be-measured object 10. The sensing element 120 may be a charge coupled device (CCD), a complementary metal-oxide semiconductor (CMOS), or other suitable types of image sensing element.

In an exemplary embodiment, the sensing element 120 may be integrated with a pulse width modulation circuit. The pulse width modulation circuit controls the light emitting time of the plurality of light emitting elements 110 and the image capturing time of the sensing element 120, to synchronize the light emitting time of the plurality of light emitting elements 110 with the image capturing time of the sensing element 120, so as to achieve an effect of precise control, but is not limited herein.

The first circuit substrate 130 includes a first substrate 132. The first substrate 132 may be a single-layer board or a multi-layer board. In addition, the first substrate 132 may have a circuit. For example, the first substrate 132 may be a printed circuit board (PCB), a flexible printed circuit board (FPCB), a glass carrier board having a circuit or a ceramic substrate having a circuit, but is not limited herein. In an exemplary embodiment, the first substrate 132 may be a translucent substrate not having a circuit.

The first substrate 132 has a first through hole T1 and a second through hole T2. The plurality of light emitting elements 110 are disposed in the first through hole T1. The sensing element 120 is disposed in the second through hole T2. In the exemplary embodiment, a sensing surface S120 of the sensing element 120 is located on the same plane as a surface S132 of the first substrate 132 facing the second circuit substrate 140, but the invention is not limited herein. Based on different needs, the sensing surface S120 of the sensing element 120 may be higher or lower than the surface S132 of the first substrate 132.

Based on different needs, the first circuit substrate 130 may further include other elements. For example, the first circuit substrate 130 may further include one or a plurality of first conductive pillars 134. The one or the plurality of the first conductive pillars 134 penetrate the first substrate 132 to be electrically connected to a circuit layer located on opposite sides of the first substrate 132. In the exemplary embodiment, the first circuit substrate 130 includes a plurality of the first conductive pillars 134 (FIG. 1C shows five first conductive pillars 134), and the plurality of first conductive pillars 134 are arranged on one side of the plurality of light emitting elements 110 away from the sensing element 120, such that the plurality of light emitting elements 110 are located between the sensing element 120 and the plurality of first conductive pillars 134. However, the number of the first conductive pillars 134 and the relative configuration relationship between the first conductive pillars 134 and other elements may change according to the requirements, and are not limited to those shown in FIG. 1C.

The second circuit substrate 140 is disposed on one side of the first circuit substrate 130. For example, the second circuit substrate 140 is disposed on the light emitting surface S110 of each light emitting element 110, the sensing surface S120 of the sensing element 120, and the surface S132 of the first substrate 132 facing the second circuit substrate 140.

The second circuit substrate 140 includes a second substrate 142. The second substrate 142 may be a single-layer board or a multi-layer board. In addition, the second substrate 142 may have a circuit. For example, the second substrate 142 may be a printed circuit board (PCB), a flexible printed circuit board (FPCB), a glass carrier board having a circuit or a ceramic substrate having a circuit, but is not limited herein. In an exemplary embodiment, the second substrate 142 may be a translucent substrate not having a circuit.

The second substrate 142 has a third through hole T3 and a fourth through hole T4. The third through hole T3 and the fourth through hole T4 may allow light beams to pass through. The third through hole T3 overlaps the first through hole T1 and exposes the light emitting surface S110 of each light emitting element 110 disposed in the first through hole T1. The fourth through hole T4 overlaps the second through hole T2 and exposes the sensing surface S120 of the sensing element 120 disposed in the second through hole T2. In this way, the light beam from each light emitting element 110 may pass through the third through hole T3 and irradiate the to-be-measured object 10, and the portion of the light beam reflected by the to-be-measured object 10 may be received by the sensing element 120 through the fourth through hole T4. In the exemplary embodiment, the number of the third through hole T3 and the fourth through hole T4 is one respectively, but is not limited herein. For example, the second substrate 142 may have a plurality of third through holes T3, and the plurality of third through holes T3 may be respectively disposed above the plurality of light emitting elements 110, but is not limited herein.

In the exemplary embodiment, the light emitting surface S110 of each light emitting element 110 and the surface S142 of the second substrate 142 away from the first circuit substrate 130 are located on the same plane, but the invention is not limited herein. Based on different needs, the light emitting surface S110 of each light emitting element 110 may be higher or lower than the surface S142 of the second substrate 142.

Based on different needs, the second circuit substrate 140 may further include other elements. For example, the second circuit substrate 140 may further include a first circuit layer 144. The first circuit layer 144 is disposed on the second substrate 142 and located between the second substrate 142 and the first substrate 132. The first circuit layer 144 is electrically connected to the sensing element 120 and the plurality of first conductive pillars 134. For example, the first circuit layer 144 may include: a plurality of conductive pads 144A electrically connected to a plurality of conductive pads P120 of the sensing element 120, a plurality of conductive wires 144B electrically connected to the plurality of conductive pads 144A, a plurality of conductive pads 144C electrically connected to the plurality of conductive wires 144B, and other conductive wires and conductive pads not shown. Each of the conductive pads P120 of the sensing element 120 is, for example, electrically connected to a corresponding first conductive pillar 134 through one of the conductive pads 144A, one of the conductive wires 144B, and one of the conductive pads 144C.

The third circuit substrate 150 is disposed on another side of the first circuit substrate 130, and the first circuit substrate 130 is located between the second circuit substrate 140 and the third circuit substrate 150. In other words, the second circuit substrate 140 and the third circuit substrate 150 are respectively located at opposite sides of the first circuit substrate 130. The light emitting element 110 is mounted on the third circuit substrate 150 and electrically connected to the third circuit substrate 150. Specifically, the third circuit substrate 150 may include a third substrate 152, a plurality of second conductive pillars 154 penetrating the third substrate 152, a second circuit layer 156, and a third circuit layer 158.

The third substrate 152 may be a single-layer board or a multi-layer board. In addition, the third substrate 152 may have a circuit. For example, the third substrate 152 may be a printed circuit board (PCB), a flexible printed circuit board (FPCB), a glass carrier board having a circuit or a ceramic substrate having a circuit, but is not limited herein. In an exemplary embodiment, the third substrate 152 may be a translucent substrate not having a circuit.

The second circuit layer 156 and the third circuit layer 158 are respectively disposed on opposite surfaces of the third substrate 152, and the plurality of second conductive pillars 154 are electrically connect to the second circuit layer 156 and the third circuit layer 158.

To be more specific, the second circuit layer 156 is located between the third substrate 152 and the first circuit substrate 130 and electrically connected to the plurality of light emitting elements 110, the plurality of first conductive pillars 134, and the plurality of second conductive pillars 154. The second circuit layer 156 may include a plurality of conductive pads 156A electrically connected to the plurality of the first conductive pillars 134, a plurality of conductive pads 156B electrically connected to the plurality of light emitting elements 110, a plurality of conductive wires 156C electrically connected to the plurality of conductive pads 156B, a plurality of conductive pads 156D electrically connected to the plurality of conductive wires 156C and other conductive wires and conductive pads not shown. The plurality of second conductive pillars 154 may include a plurality of second conductive pillars 154A electrically connected to the plurality of conductive pads 156A and a plurality of second conductive pillars 154B electrically connected to the plurality of conductive pads 156D. The third circuit layer 158 may include a plurality of conductive pads 158A electrically connected to the plurality of second conductive pillars 154A, a plurality of conductive pads 158B electrically connected to the plurality of second conductive pillars 154B and other conductive wires and conductive pads not shown. Each conductive pad 156A is, for example, electrically connected to a corresponding conductive pad 158A through one of the second conductive pillars 154A, such that each of the conductive pads P120 of the sensing element 120 may be electrically connected to a corresponding conductive pad 158A through one of the conductive pads 144A, one of the conductive wires 144B, one of the conductive pads 144C, one of the first conductive pillars 134, one of the conductive pads 156A and one of the second conductive pillars 154A. In addition, each light emitting element 110 is, for example, electrically connected to a corresponding conductive pad 158B through one of the conductive pads 156B, one of the conductive wires 156C, one of the conductive pads 156D and one of the second conductive pillars 154B.

In this way, although the plurality of conductive pads P120 of the sensing device 120 is located on one side of the sensing element 120 facing the second circuit substrate 140, the plurality of conductive pads P120 of the sensing element 120 may still be electrically connected to the third circuit layer 158 located on the surface of the third substrate 152 away from the second circuit substrate 140 through the first circuit layer 144 located between the first substrate 132 and the second substrate 142, the plurality of first conductive pillars 134 penetrate the first substrate 132, the second circuit layer 156 located between the first substrate 132 and the third substrate 152, and the plurality of second conductive pillars 154A penetrate the third substrate 152, and the plurality of conductive pads P120 of the sensing element 120 may be connected to an external circuit by the third circuit layer 158. On the other hand, the plurality of light emitting elements 110 may be surface mounted on the second circuit layer 156, and the plurality of light emitting elements 110 may be electrically connected to the third circuit layer 158 through the second circuit layer 156 and the plurality of second conductive pillars 154B penetrating the third substrate 152, and connected to the external circuit via the third circuit layer 158.

Based on different needs, the image capturing module 100 may further include other film layers. For example, the image capturing module 100 may further include a plurality of adhesive layers for fixing. As shown in FIG. 1A and FIG. 1B, the first circuit substrate 130 and the second circuit substrate 140 may be bonded to each other through a first adhesive layer AD1. The second circuit substrate 140 and the third circuit substrate 150 may be bonded to each other through a second adhesive layer AD2. A third adhesive layer AD3 may be further disposed in the second through hole T2, and the sensing element 120 is fixed in the second through hole T2 of the first substrate 130 through the third adhesive layer AD3. A fourth adhesive layer AD4 may be further disposed in the first through hole T1, and the light emitting elements 110 are fixed in the first through hole T1 of the first substrate 130 through the fourth adhesive layer AD4. In an exemplary embodiment, any one of the above adhesive layers may be replaced by a mechanical component for fixing or a fastening structure.

In addition, the image capturing module 100 may also further include a translucent protective layer 160. The translucent protective layer 160 is disposed in the third through hole T3 and the fourth through hole T4, to protect the sensing element 120 and the plurality of light emitting elements 110 (for example, preventing the sensing surface S120 of the sensing element 120 and the light emitting surface S110 of each light emitting element 110 from being scratched). In addition to the function of providing protection, the translucent protective layer 160 may also fill and level up the third through hole T3 and the fourth through hole T4, that is, a surface S160 of the translucent protective layer 160 away from the light emitting surface S110, and a surface S142 of the second substrate 142 away from the first circuit substrate 130 are located on a same plane. In this way, a structure where the pressing surface (the contact surface of the to-be-measured object 10) is a full-planar may be achieved, making it easier for the image capturing module 100 to be combined with other electronic devices. In an exemplary embodiment, the translucent protective layer 160 may be omitted, and a translucent protective cover may be further disposed on the second substrate 142, and the protective cover covers the second substrate 142, the sensing element 120 and the plurality of light emitting elements 110, wherein the second substrate 142 and the protective cover can be fixed through an adhesive layer, a mechanical component or a fastening structure.

As compared to disposing the light emitting element 110 and the sensing element 120 on the first substrate 132 and then electrically connecting the light emitting element 110 and the sensing element 120 to the first substrate 132 by a wire bonding process, disposing the light emitting element 110 and the sensing element 120 in the through holes (including the first through hole T1 and the second through hole T2) of the first substrate 132 and forming the required circuit on opposite sides of the first substrate 132 is contributed to reducing the overall thickness of the image capturing module 100. In addition, forming through holes in the first substrate 132 and disposing the light emitting elements 110 and the sensing element 120 in the through holes of the first substrate 132 may allow a partition wall to be formed naturally between the light emitting element 110 and the sensing element 120. In this way, an opaque element may not be needed to be additionally disposed between the light emitting element 110 and the sensing element 120, which can effectively prevent light interferences caused by large angle light beams emitted from the light emitting element 110 from irradiating directly onto the sensing element 120, thereby, enhancing the recognition ability of the image capturing module 100. Accordingly, the thickness of the image capturing module 100 is thin and the image capturing module 100 has good recognition ability.

Figure 7A:
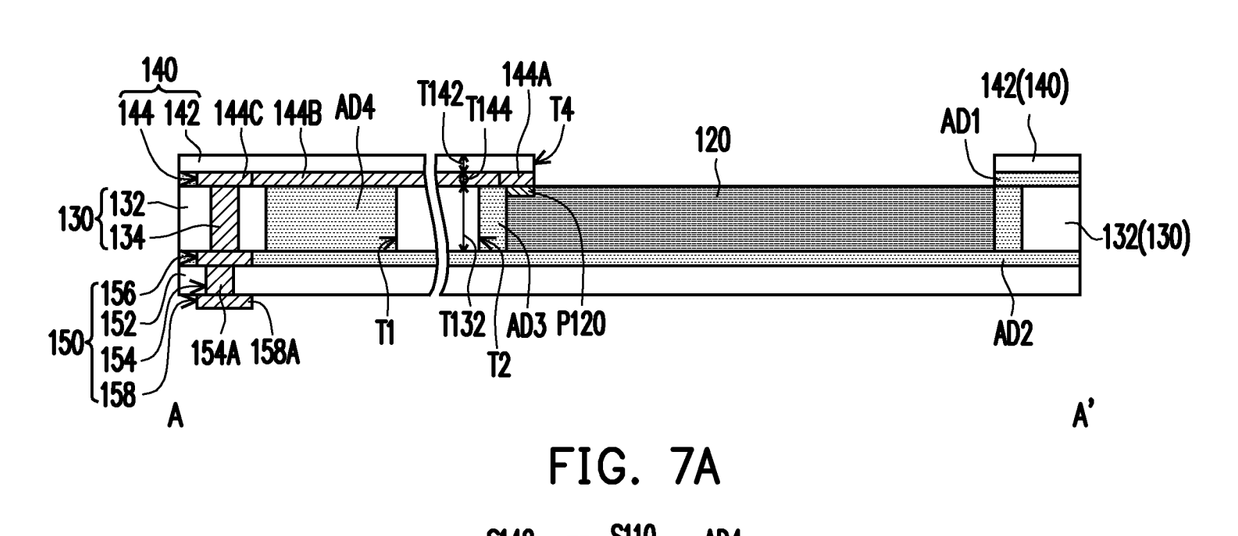
Figure 7B:
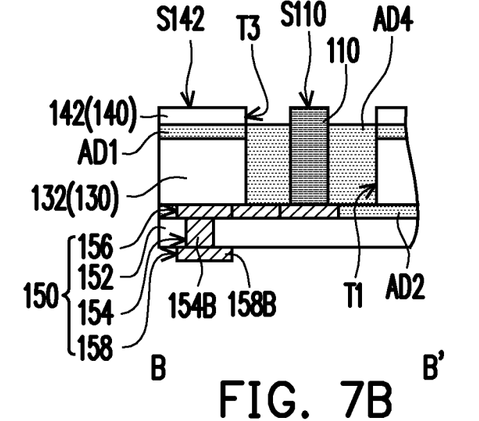
Figure 8A:
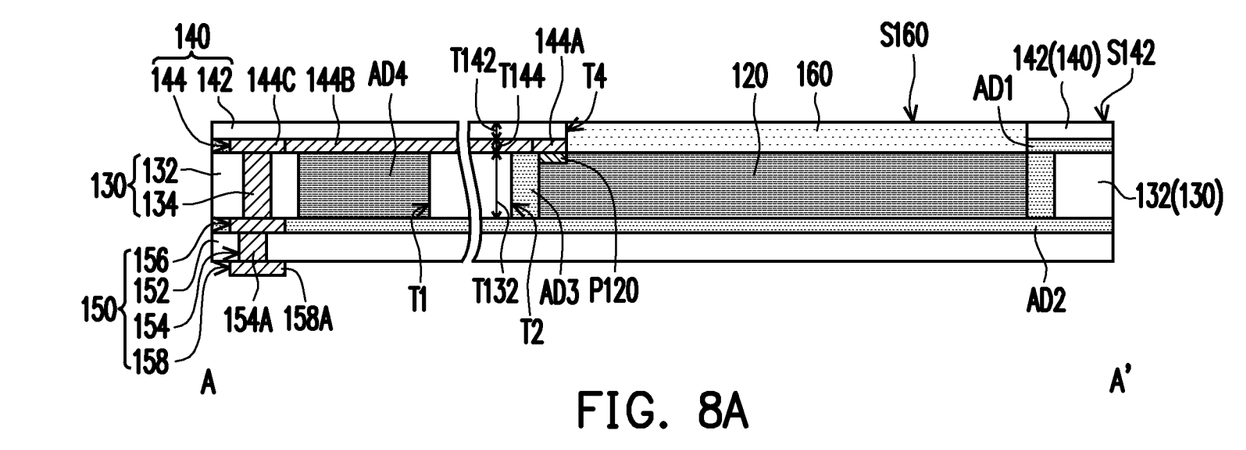
Figure 8B:
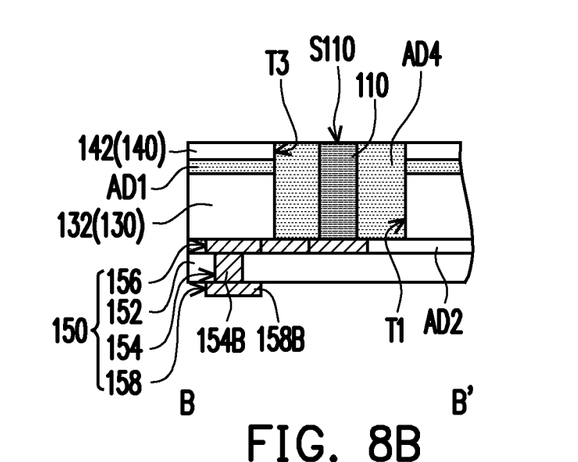
Figure 9:
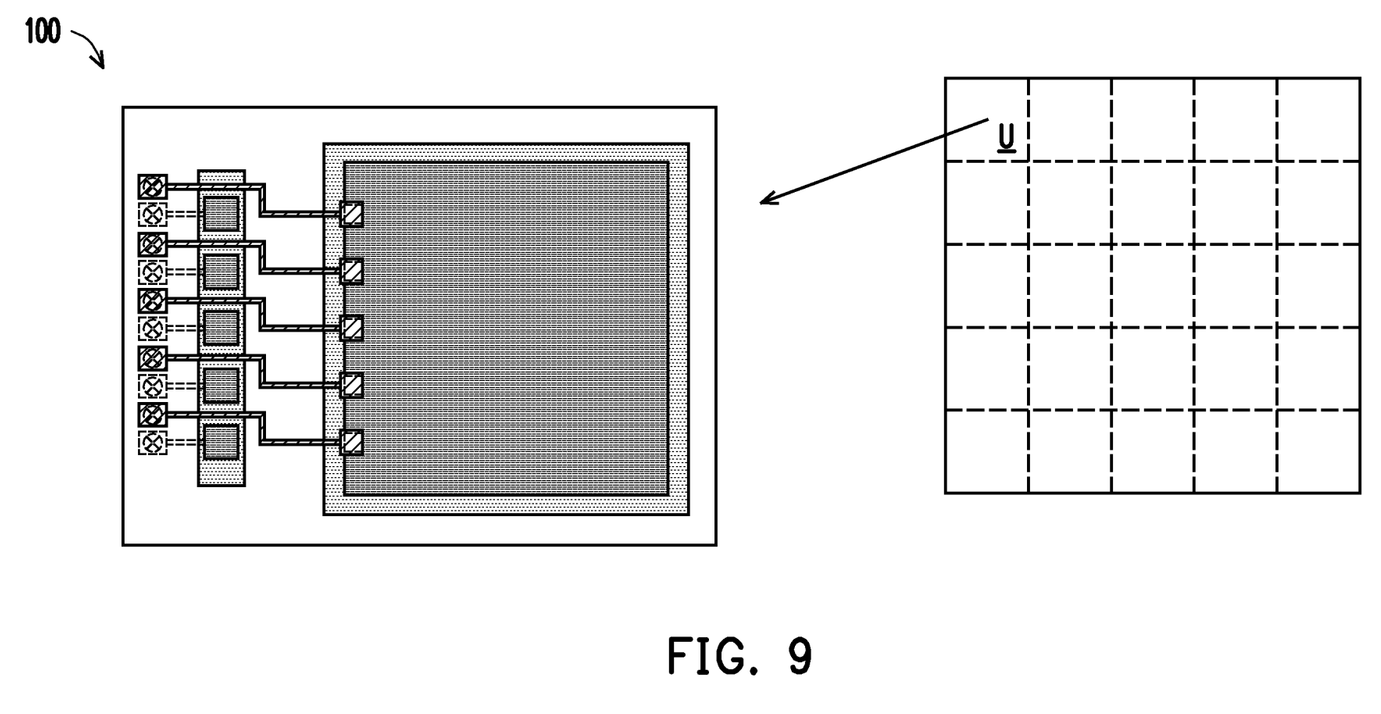

FIG. 2A to FIG. 9 are schematic views of the manufacturing process of the image capturing module according to the first exemplary embodiment of the invention. However, the manufacturing method of the image capturing module 100 of FIG. 1A to FIG. 1C is not limited those shown in FIG. 2A to FIG. 9. In addition, FIGS. 2A, 3A, 4A, 5A, 6A, 7A, and 8A show the manufacturing process of the profile corresponding to FIG. 1A. FIGS. 2B, 3B, 4B, 5B, 6B, 7B, and 8B show the manufacturing process of the profile corresponding to FIG. 1B. FIG. 9 is a schematic top view, wherein a plurality of image capturing modules formed via a cutting step is shown.

Figure 2A:
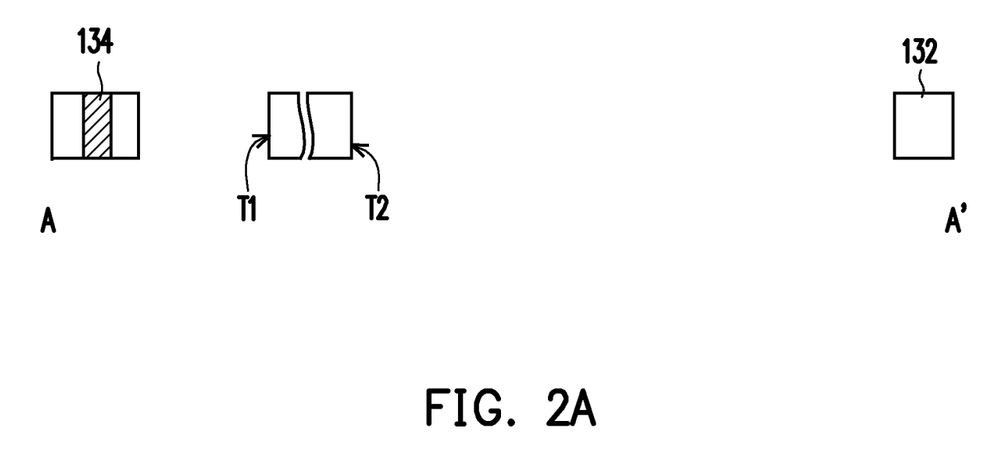
Figure 2B:
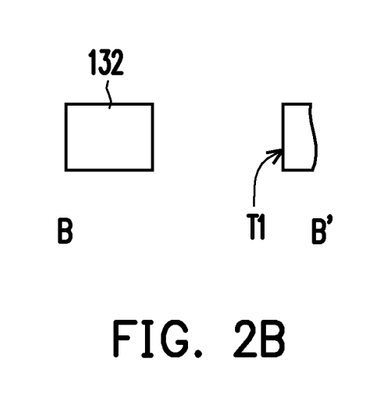

Referring to FIG. 2A and FIG. 2B, the first substrate 132 is provided, and the first through hole T1 for disposing the light emitting element and the second through hole T2 for disposing the sensing element are formed in the first substrate 132. In this step, the first conductive pillar 134 penetrating the first substrate 132 may be further formed.

Figure 3A:
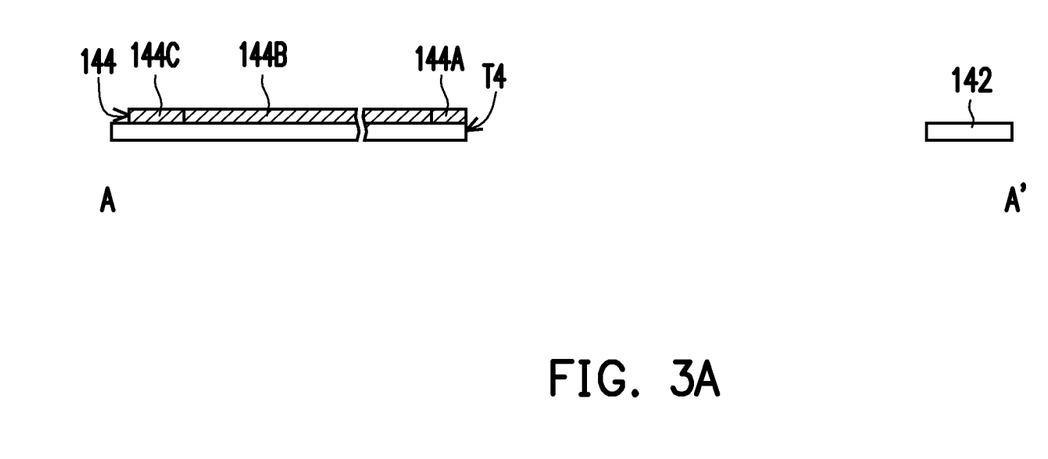
Figure 3B:
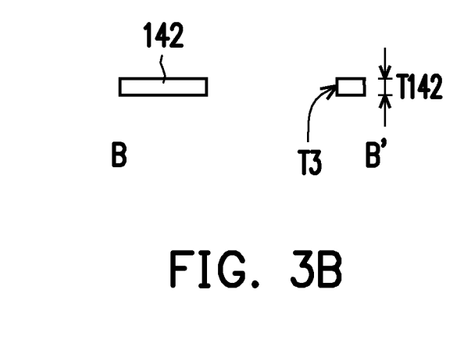

Referring to FIG. 3A and FIG. 3B, the second substrate 142 is provided, and the third through hole T3 and the fourth through hole T4 are formed in the second substrate 142. In this step, the second circuit layer 144 may be further formed on one side of the second substrate 142. The second circuit layer 144 is a patterned conductive layer, wherein the elements included are referring to the corresponding paragraphs above, and shall not be repeated herein.

Figure 4A:
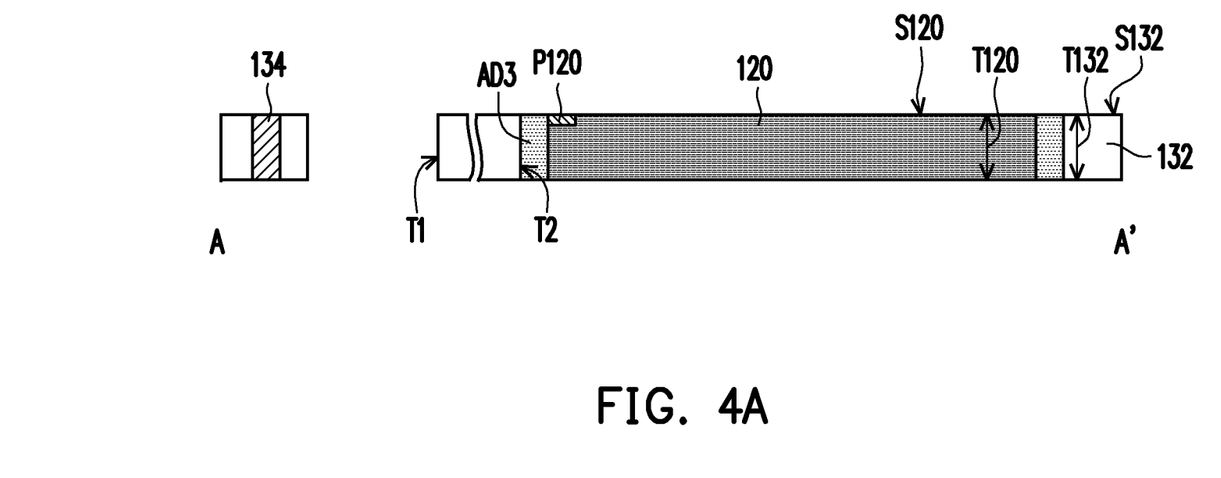
Figure 4B:
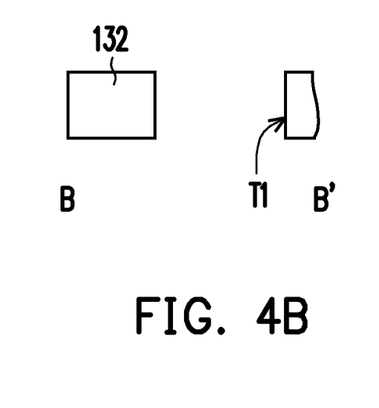

Referring to FIG. 4A and FIG. 4B, the sensing element 120 is disposed in the second through hole T2. In the exemplary embodiment, the method of disposing the sensing element 120 in the second through hole T2 includes, making the conductive pad P120 of the sensing element 120 face one side of the first substrate 132 where the second substrate 142 is to be disposed, then filling the third adhesive layer AD3 in the second through hole T2 by an underfill method, so as to fix the sensing element 120 in the second through hole T2 of the first substrate 132 by the third adhesive layer AD3, but the invention is not limited herein. In another exemplary embodiment, the sensing element 120 may be fixed in the second through hole T2 of the first substrate 132 through other method, so as to omit the third adhesive layer AD3.

In addition, before the sensing element 120 is disposed in the second through hole T2, a grinding process may be carried out on the sensing element 120, such that a thickness T120 of the sensing element 120 is equals to a thickness T132 of the first substrate 132. In this way, after the sensing element 120 is disposed in the second through hole T2, the sensing surface S120 of the sensing element 120 and the surface S132 of the first substrate 132 may be located on the same plane, but the invention is not limited herein. Based on different needs, the sensing surface S120 of the sensing element 120 may also be higher or lower than the surface S132 of the first substrate 132. Alternatively, in the case where the thickness T120 of the sensing element 120 is already of a preset thickness, the grinding process may be omitted.

Figure 5A:
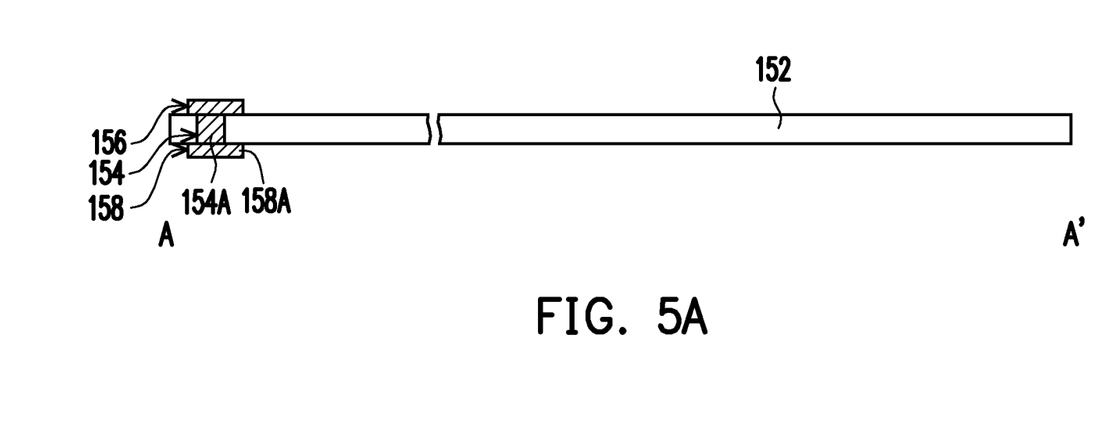
Figure 5B:
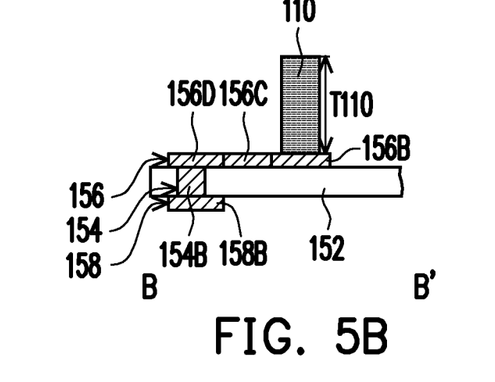

Referring to FIG. 5A and FIG. 5B, the third substrate 152 is provided, and the light emitting element 110 is disposed on the third substrate 152. In the exemplary embodiment, before the light emitting element is disposed on the third substrate 152, the plurality of second conductive pillars 154 may first be formed in the third substrate 152 (including the second conductive pillar 154A and the second conductive pillar 154B), and the second circuit layer 156 and the third circuit layer 158 are respectively formed on two opposite surfaces of the third substrate 152. After that, the light emitting element 110 is then fixed on the second circuit layer 156. The second circuit layer 156 and the third circuit layer 158 are respectively patterned conductive layers, wherein the elements included are referring to the corresponding paragraphs above, and shall not be repeated herein.

Before the light emitting element 110 is disposed on the third substrate 152, the grinding process may still be carried out on the light emitting element 110 first, so that the thickness T110 of the light emitting element 110 is equals to the total of (refer to FIG. 7B) the thickness T132 of the first substrate 132 to be bonded, the thickness T142 of the second substrate 142 to be bonded, the thickness T144 of the first circuit layer 144 to be bonded (or the thickness of the first adhesive layer AD1). In this way, after the light emitting element 110 is disposed in the first through hole T1 (refer to FIG. 7B), the light emitting surface S110 of the light emitting element 110 and the surface S142 of the second substrate 142 away from the first substrate 132 may be located on the same plane, but the invention is not limited therein. Based on different needs, the light emitting surface S110 of the light emitting element 110 may also be higher or lower than the surface S142 of the second substrate 142. Alternatively, in the case where the thickness T110 of the light emitting element 110 is already of a preset thickness, the grinding process may be omitted.

It should be noted that the steps of FIG. 2A and FIG. 2B to the steps of FIG. 5A and FIG. 5B, are the pre-steps before bonding the first substrate 132, the second substrate 142 and the third substrate 152, whereby the order of these steps may be changed depending on the situation, and are not limited to the order shown in the embodiment of the invention.

Figure 6A:
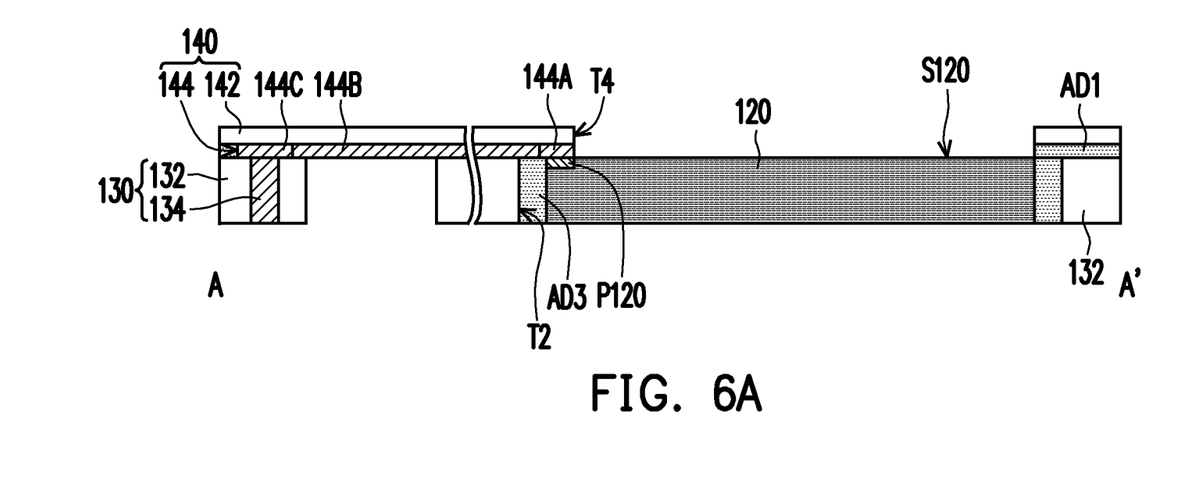
Figure 6B:
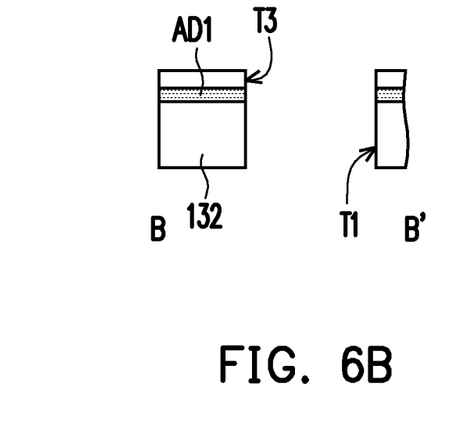

Referring to FIG. 6A and FIG. 6B, the first circuit layer 144 located on the second substrate 142 faces the first substrate 132, and the first substrate 132 and the second substrate 142 are bonded by the first adhesive layer AD1. After bonding the first substrate 132 and the second substrate 142, the third through hole T3 overlaps the first through hole T1, the fourth through hole T4 overlaps the second through hole T2, and exposes the sensing surface S120 of the sensing element 120 disposed in the second through hole T2. In addition, the first circuit layer 144 is located between the second substrate 142 and the first substrate 132, and the first circuit layer 144 is electrically connected to the sensing element 120 and the first conductive pillar 134. In an exemplary embodiment, before bonding the first substrate 132 and the second substrate 142, solder balls (not shown) may first be implanted on the conductive pad P120 of the sensing element 120, the solder balls on the conductive pad P120 are then respectively electrically connected to the corresponding circuit in the first circuit layer 144, but is not limited herein.

Referring to FIG. 7A and FIG. 7B, the second substrate 142 and the third substrate 152 are bonded through the second adhesive layer AD2. After the second substrate 142 and the third substrate 152 are bonded, the second circuit layer 156 is located between the third substrate 152 and the first substrate 132 and electrically connected to the light emitting element 110, the first conductive pillar 134 and the plurality of the second conductive pillars 154, and the third circuit layer 158 is electrically connected to the plurality of the second conductive pillars 154. In addition, the light emitting element 110 is disposed in the first through hole T1. In the exemplary embodiment, the light emitting element 110 is fixed in the first through hole T1 of the first substrate 132 through the fourth adhesive layer AD4, but is not limited herein.

Referring to FIG. 8A and FIG. 8B, a translucent protective layer 160 is formed in the third through hole T3 and the fourth through hole T4. In the exemplary embodiment, a method of forming the translucent protective layer 160 is, for example, by forming the translucent material in the third through hole T3 and the fourth through hole T4 by a coating method, and then curing the translucent material by a thermal curing or a photocuring process, but is not limited herein.

The surface S160 of the translucent protective layer 160 away from the light emitting surface S110 and the surface S142 of the second substrate 142 away from the first circuit substrate 130 may be located on the same plane, but is not limited herein. In another exemplary embodiment, the translucent material may also further cover the surface S142 of the second substrate 142. In this way, a structure where the pressing surface (the contact surface of the to-be-measured object) is a full-planar may be achieved.

Through the above steps, the image capturing module 100 is preliminary completed. In an exemplary embodiment, as shown in FIG. 9, a plurality of image capturing unit U may also be manufactured at the same time, and a plurality of image capturing modules 100 are cut out by a cutting process (along the dotted lines in FIG. 9).

Figure 10A:
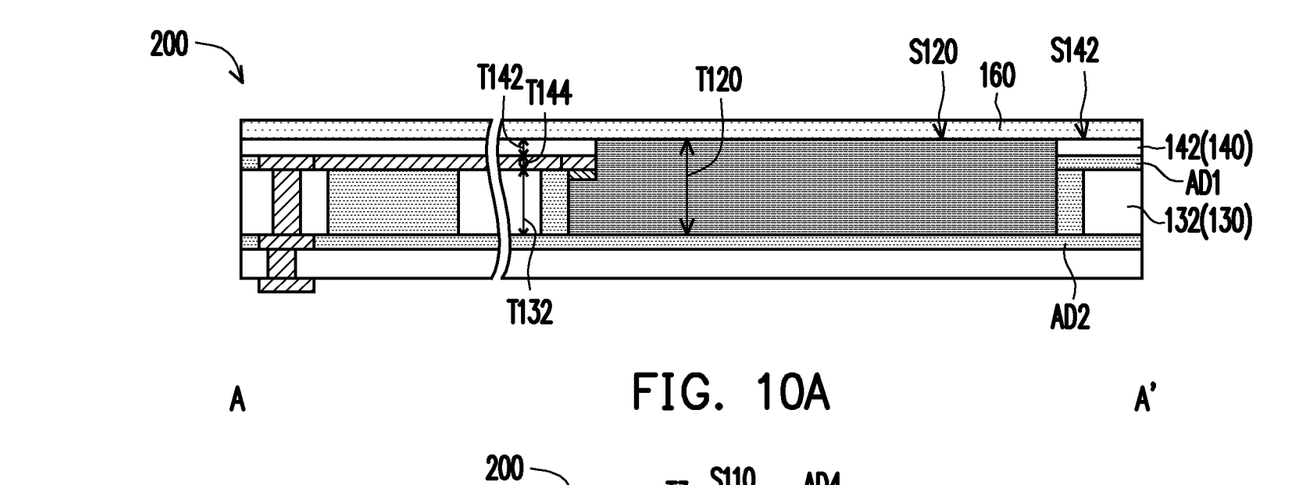
FIG. 10A and FIG. 10B are respectively cross-sectional schematic views of different parts of an image capturing module according to a second exemplary embodiment of the invention.
Figure 10B:
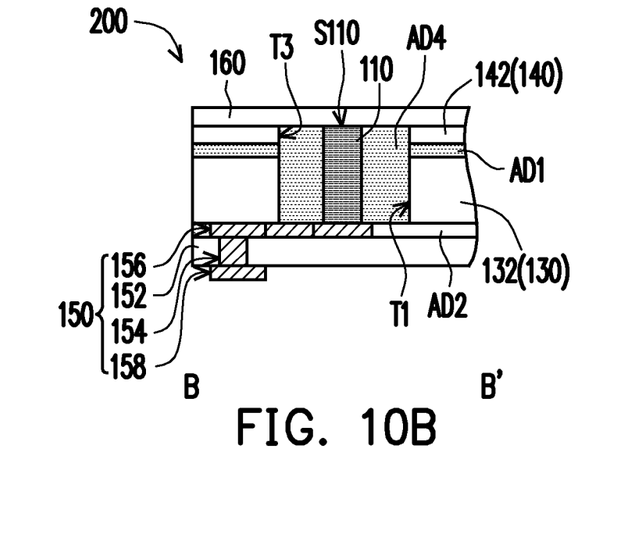

FIG. 10A and FIG. 10B are respectively cross-sectional schematic views of different parts of an image capturing module according to a second exemplary embodiment of the invention. Referring to FIG. 10A and FIG. 10B, an image capturing module 200 according to the second exemplary embodiment is similar to the image capturing module 100 as shown in FIG. 1A and FIG. 1B, wherein the same elements are represented using the same reference numerals, and the material, relative configuration relationship, manufacturing method, effect and so on, of these elements, shall not be repeated herein. The main differences between the image capturing module 200 and the image capturing module 100 are described as below.

In the image capturing module 200, the sensing surface S120 of the sensing element 120 and the surface S142 of the second substrate 142 away from the first circuit substrate 130 are located on the same plane. Correspondingly, before the sensing element 120 is disposed in the second through hole T2, the thickness T120 of the light emitting element 120 may first be made equal to the total of the thickness T132 of the first substrate to be bonded, the thickness T142 of the second substrate 142 to be bonded, and the thickness T144 of the first circuit layer 144 to be bonded.

By locating the sensing surface S120 of the sensing element 120 and the surface S142 of the second substrate 142 away from the first circuit substrate 130 on the same plane, the sensing surface S120 may be closer to the to-be-measured object, thereby, achieving the effect of enhancing the image. Under such a structure, the step of thinning the thickness of the sensing element 120 in FIG. 4A may be omitted, or the time to thin the thickness of the sensing element 120 may be reduced, and thus help reduce the manufacturing time of the image capturing module 200. In an exemplary embodiment, the sensing surface S120 of the sensing element 120 may also be higher than the surface S132 of the first substrate 132 facing the second circuit substrate 140 and lower than the surface S142 of the second substrate 142 away from the first circuit substrate 130. Correspondingly, before the sensing element 120 is disposed in the second through hole T2, the thickness T120 of the light emitting element 120 may first be made greater than the thickness T132 of the first substrate 132 and lesser than the total of the thickness T132 of the first substrate 132, the thickness T142 of the second substrate 142, and the thickness T144 of the first circuit layer 144.

In the exemplary embodiment, the image capturing module 200 may also include a translucent protective layer 160. The translucent protective layer 160 is disposed on the surface S142 of the second substrate 142 away from the first circuit substrate 130 and covers the light emitting surface S110 of the light emitting element 110 and the sensing surface S120 of the sensing element 120. In another exemplary embodiment, the translucent protective layer 160 may be omitted, and a translucent protective cover is further disposed on the second substrate 142, such that the protective cover covers the second substrate 142, the sensing element 120, and the plurality of light emitting elements 110, wherein the second substrate 142 and the protective cover may be fixed through an adhesive layer, a mechanical component or a fastening structure.

Based on the above, in the image capturing module of an embodiment of the present invention, the light emitting element and the sensing element are disposed in through holes of the first substrate, and help to reduce the overall thickness of the imaging capturing module. In addition, forming through holes in the first substrate and disposing the light emitting element and the sensing element in the through holes of the first substrate may allow a partition wall to be formed naturally between the light emitting element and the sensing element, which may effectively prevent light interferences caused by large angle light beams of the light emitting element from irradiating directly onto the sensing element, thereby, enhancing the recognition ability of the image capturing module. Accordingly, the thickness of the image capturing module is thin and the image capturing module has a good recognition ability. In an exemplary embodiment, the translucent protective layer may fill the location of the through holes. In this way, a structure where the pressing surface is a full-planar may be achieved, making it easier for the image capturing module to be combined with other electronic devices. In another exemplary embodiment, the effect of enhancing the image may also be achieved by reducing the distance between the sensing surface of the sensing element and the to-be-measured object. In addition, in the method of manufacturing the image capturing module of the embodiment of the invention, before filling the adhesive layer for fixing the first substrate and the second substrate, the light emitting element and the sensing element are already fixed in the through holes of the first substrate, and the relevant circuit is produced through lamination and electrically connected with the light emitting element and the sensing element. Therefore, when filling the adhesive layer for fixing the first substrate and the second substrate, the light emitting element, the sensing element and the related circuit are not easily prone to the problems of being displaced or disconnected. In addition, since the opaque element may not be needed to be additionally formed between the light emitting element and the sensing element, the manufacturing time and cost may be reduced. In an exemplary embodiment, the step of thinning the sensing element may also be omitted, or the time required to thin the thickness of the sensing element may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An image capturing module comprising:
    a lighting emitting element;
    a sensing element;
    a first circuit substrate, comprising a first substrate, the first substrate having a first through hole and a second through hole, wherein the light emitting element is disposed in the first through hole, and the sensing element is disposed in the second through hole;
    a second circuit substrate, disposed on one side of the first circuit substrate and comprising a second substrate, the second substrate having a third through hole and a fourth through hole, wherein the third through hole overlaps the first through hole and exposes a light emitting surface of the light emitting element disposed in the first through hole, the fourth through hole overlaps the second through hole and exposes a sensing surface of the sensing element disposed in the second through hole; and
    a third circuit substrate, disposed on another side of the first circuit substrate, and the first circuit substrate is located between the second circuit substrate and the third circuit substrate, wherein the light emitting element is mounted on the third circuit substrate and electrically connected to the third circuit substrate;
    wherein the first circuit substrate further comprises a first conductive pillar penetrating the first substrate, the second circuit substrate further comprises a first circuit layer, the first circuit layer is disposed on the second substrate and located between the second substrate and the first substrate, the first circuit layer is electrically connected to the sensing element and the first conductive pillar, the third circuit substrate comprises a third substrate, a plurality of second conductive pillars penetrating the third substrate, a second circuit layer and a third circuit layer, the second circuit layer and the third circuit layer are respectively disposed on opposite surfaces of the third substrate, wherein the second circuit layer is located between the third substrate and the first circuit substrate and electrically connected to the light emitting element, the first conductive pillar and the second conductive pillars, and the third circuit layer is electrically connected to the second conductive pillars.

2. The image capturing module of claim 1, wherein the sensing surface of the sensing element and a surface of the second substrate away from the first circuit substrate are located on the same plane, or the sensing surface of the sensing element is higher than a surface of the first substrate facing the second circuit substrate and lower than the surface of the second substrate away from the first circuit substrate.

3. The image capturing module of claim 1, further comprising:
    a first adhesive layer, wherein the first circuit substrate and the second circuit substrate are bonded to each other through the first adhesive layer.

4. The image capturing module of claim 1, further comprising:
    a second adhesive layer, wherein the second circuit substrate and the third circuit substrate are bonded to each together through the second adhesive layer.

5. The image capturing module of claim 1, further comprising:
    a third adhesive layer, disposed in the second through hole, wherein the sensing element is fixed in the second through hole of the first substrate through the third adhesive layer.

6. The image capturing module of claim 1, further comprising:
    a fourth adhesive layer, disposed in the first through hole, wherein the light emitting element is fixed in the first through hole of the first substrate through the fourth adhesive layer.

7. The image capturing module of claim 1, wherein a conductive pad of the sensing element is located on one side of the sensing element facing the second circuit substrate, and the conductive pad of the sensing element is electrically connected to the third circuit layer through the first circuit layer, the first conductive pillar, the second circuit layer and one of the second conductive pillars, the light emitting element is surface mounted on the second circuit layer, and the light emitting element is electrically connected to the third circuit layer through the second circuit layer and the other one of the second conductive pillars.

8. The image capturing module of claim 1, further comprising:
    a translucent protective layer, disposed in the third through hole and the fourth through hole.

9. The image capturing module of claim 1, further comprising:
a translucent protective layer, disposed on a surface of the second substrate away from the first circuit substrate and covering the light emitting surface of the light emitting element and the sensing surface of the sensing element.

10. The image capturing module of claim 1, wherein the light emitting surface of the light emitting element and a surface of the second substrate away from the first circuit substrate are located on the same plane.

11. The image capturing module of claim 1, wherein the sensing surface of the sensing element and a surface of the first substrate facing the second circuit substrate are located on the same plane.

* * * * *